United States Patent [19]

Nakayama et al.

[11] Patent Number: 5,233,610
[45] Date of Patent: Aug. 3, 1993

[54] SEMICONDUCTOR MEMORY DEVICE HAVING ERROR CORRECTING FUNCTION

[75] Inventors: Takeshi Nakayama; Yasushi Terada; Masanori Hayashikoshi; Kazuo Kobayashi; Yoshikazu Miyawaki, all of Hyogo, Japan

[73] Assignee: Mitsubishi Denki Kabushiki Kaisha, Tokyo, Japan

[21] Appl. No.: 574,039

[22] Filed: Aug. 29, 1990

[30] Foreign Application Priority Data

Aug. 30, 1989 [JP] Japan .................. 1-223419

[51] Int. Cl.$^5$ .......................................... G06F 11/00
[52] U.S. Cl. ....................... 371/5.1; 371/5.2; 371/21.1; 371/40.1; 365/200; 365/201
[58] Field of Search .............. 371/5.1, 5.2, 5.3, 5.5, 371/21.1, 40.1, 40.3, 21.4, 6, 14; 365/200, 201

[56] References Cited

U.S. PATENT DOCUMENTS

| | | | |
|---|---|---|---|
| 3,787,670 | 1/1974 | Nelson | 371/4 |
| 3,814,922 | 6/1974 | Nibby et al. | 371/5.1 |
| 4,053,751 | 10/1977 | Ault | 371/5.1 |
| 4,069,970 | 1/1978 | Buzzard | 371/5.1 X |
| 4,203,158 | 5/1980 | Frohman-Bentchkowsky et al. | 365/185 |
| 4,216,541 | 8/1980 | Clover | 371/5.1 X |
| 4,414,665 | 11/1983 | Kimura et al. | 371/21.1 |
| 4,584,681 | 4/1986 | Singh et al. | 371/10.1 |
| 4,612,640 | 9/1986 | Mehrotra et al. | 371/51.1 |
| 4,809,276 | 2/1989 | Lemay et al. | 371/40.1 |
| 4,899,313 | 2/1990 | Kumanoya et al. | 365/201 |
| 4,958,352 | 9/1990 | Noguchi | 371/5.1 X |
| 4,963,825 | 10/1990 | Mielke | 371/21.4 X |

FOREIGN PATENT DOCUMENTS 63-184854 7/1988 Japan .
63-310045 12/1988 Japan .

OTHER PUBLICATIONS

Hamming, R. W., "Error Detecting and Error Correcting Codes", *The Bell System Technical Journal*, vol. 24, No. 2, pp. 147-160, Apr. 1950.
Chen, C. L. and Hsiao, M. Y., "Error-Correcting Codes for Semiconductor Memory Applications: A State-of-the-Art Review," *IBM Journal of Research and Development*, vol. 28, No. 2, pp. 124-134, Mar. 1984.
Furutani, K., et al. "A Built-in Hamming code ECC Circuit for DRAM's", *IEEE Journal of Solid-state Circuit*, vol. 24, No. 1, pp. 50-56, Feb. 1989.
Mehrotra, S., et al. "Session X: Nonvolatile Memories-THAM 10.4: A 64Kb CMOS EEROM with On-Chip ECC", *IEEE International Solid-State Circuits Conference*, ISSCC 84, pp. 142-143, Feb. 23, 1984.

*Primary Examiner*—Robert W. Beausoliel, Jr.
*Assistant Examiner*—Ly V. Hua
*Attorney, Agent, or Firm*—Lowe, Price, LeBlanc & Becker

[57] ABSTRACT

A semiconductor memory device comprises a memory array, a test mode detecting circuit, an address counter, a correction circuit, and a data counter. When a test mode enable signal is applied externally to the test mode detecting circuit, the address counter sequentially addresses the memory array. The correction circuit detects the error of the data sequentially read out from the memory array. The data counter counts the number of data to be corrected by said correction circuit. The counting result is outputted to the exterior.

26 Claims, 7 Drawing Sheets

SEMICONDUCTOR MEMORY DEVICE HAVING ERROR CORRECTING FUNCTION

CROSS-REFERENCE TO RELATED APPLICATION

The present application is related to copending application Ser. No. 253,001 filed on Oct. 4, 1988 and assigned to the same assignee of the present application.

BACKGROUND OF THE INVENTION

1. Field of the Invention

The present invention relates generally to semiconductor memory devices, and more particularly, to semiconductor memory devices having error correcting function.

2. Description of the Background Art

In many cases, an electrically programmable non-volatile memory, particularly EEPROM (Electrically Erasable and Programmable Read Only Memory) contains an error correcting circuit (referred to as ECC (Error Correcting Code) circuit hereinafter) for ensuring error free programming thereof more than ten thousand times. In the EEPROM, bit defects are generated because of deterioration of an oxide film with the number of programming increasing. An EEPROM is disclosed, for example, in U.S. Pat. No. 4,203,158. In such a memory, in case several bits become defective, the ECC circuit detects the defects and corrects the same to read correct data.

Figure 8:
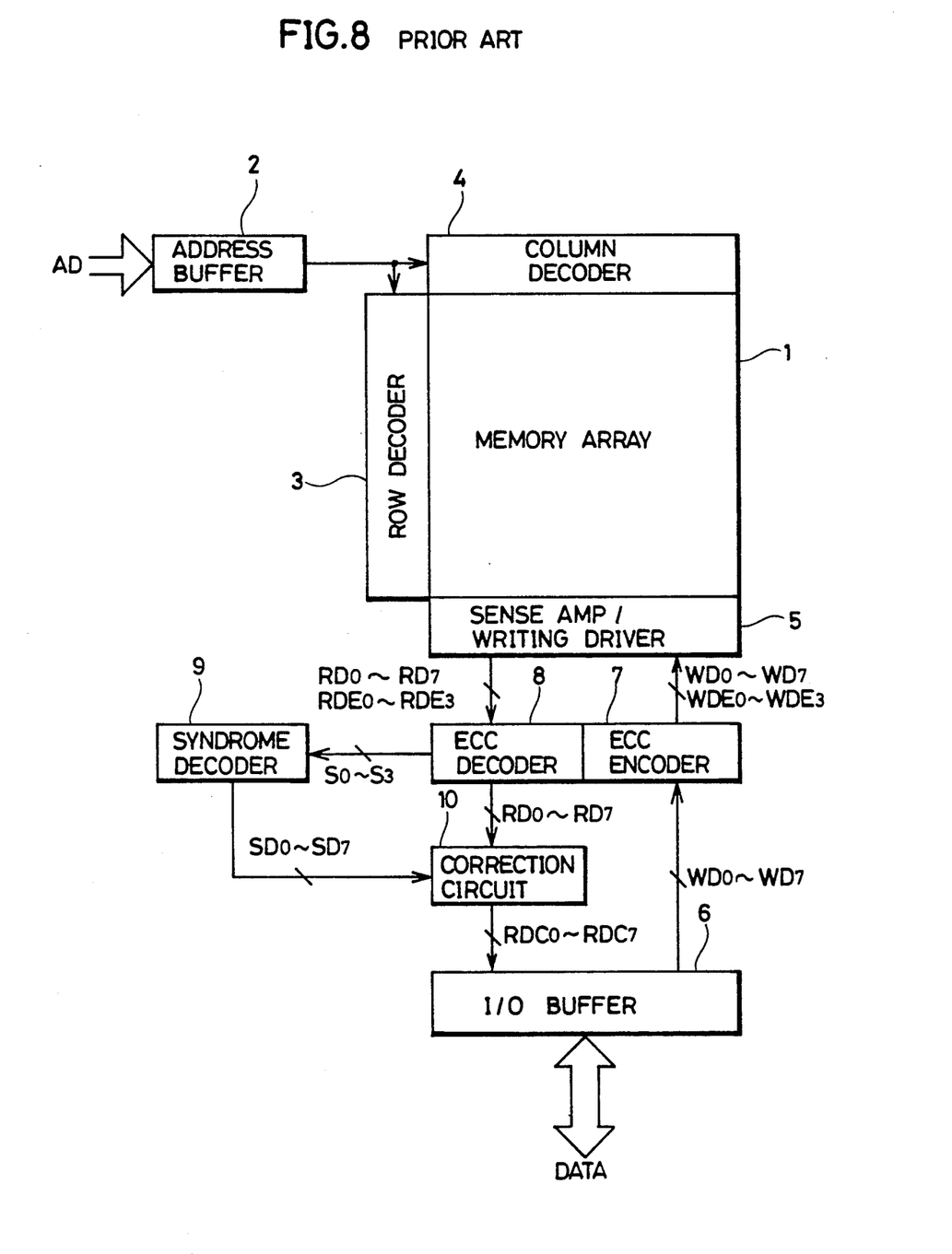
FIG. 8 is a block diagram showing a structure of a conventional semiconductor memory device.

FIG. 8 is a block diagram showing a structure of a conventional semiconductor memory device containing an ECC circuit. In the semiconductor memory device of FIG. 8, a SEC (Single Error Correcting) code is used as an error correcting code. An error correcting code is described, for example, in R. W. Hamming, "Error Detecting and Error Correcting Codes", Bell Syst. Tech. J. 29, 147–160 (April 1950) and C. L. Chen and M. Y. Hsiao, "Error-Correcting Codes for Semiconductor Memory Applications: A State-of-the-Art Review", IBM J. RES. DEVELOP. 28, 124–134 (March 1984).

In FIG. 8, a memory array 1 comprises a plurality of memory cells arranged in a plurality of rows and columns. Each memory is comprised, for example, EEPROM cells. An address buffer 2 receives an externally applied address signal AD and applies the same to a row decoder 3 and a column decoder 4. The row decoder 3 selects one row in the memory array 1 in response to the address signal. The column decoder 4 selects a plurality of columns, for example 12 columns in the memory array 1 in response to the address signal. As a result, 12 memory cells are selected in the memory array 1.

In writing, data is written in the selected memory cells through a writing driver in a sense amplifier/writing driver 5. In reading, the data stored in the selected memory cells are amplified by the sense amplifier in the sense amplifier/writing driver 5 and outputted.

The semiconductor memory device contains an ECC circuit comprising an ECC encoder 7, an ECC decoder 8, a syndrome decoder 9 and a correction circuit 10. In the ECC circuit of FIG. 8, 4 bits of check bits are conventionally generated with respect to 8 bits (one byte) of the information bits.

Now reading operation and writing operation of the semiconductor memory device of FIG. 8 will be described.

First, in writing, 8 bits of data WD0–WD7 applied from the exterior is inputted in the ECC encoder 7 through an I/O buffer 6. The ECC encoder 7 generates 4 bits of check bits WDE0–WDE3 based on the inputted 8 bits of the data WD0–WD7. At the same time, the address signal is applied externally to the address buffer 2 and in response thereto 12 bits of memory cell are selected by the row decoder 3 and the column decoder 4. The above described 8 bits of the data WD0–WD7 and the 4 bits of the check bits WDE0–WDE3 are transferred to the sense amplifier/writing driver 5, and which bits are written into the selected memory cells in the memory array 1.

In reading, the 12 bits of data RD0–RD7 and RDE0–RDE3 stored in the memory cells selected by the row decoder 3 and the column decoder 4 are read out to be amplified in the sense amplifier/writing driver 5, and then applied to the ECC decoder 8.

The ECC decoder 8 generates 4 bits of syndromes S0–S3 based on the read out 12 bits of the data RD0–RD7 and RDE0–RDE3. Syndromes are described in H. Furutani et al., "A Built-In Hamming Code ECC Circuit for DRAM's", IEEE JOURNAL OF SOLID-STATE CIRCUITS, 24, 50–56 (February 1989) The syndrome decoder 9 decodes the syndromes S0–S3 to generate the 8 bits of the data SD0–SD7. When some of the data RD0–RD7 are erroneous, the corresponding bits in the 8 bits of the data SD0–SD7 are active. Therefore, the correction circuit 10 inverts bits in the read out data RD0–RD7 which correspond to the active bits in the 8 bit data SD0–SD7. Through the above described operation, the corrected data RDC0–RDC7 is externally outputted through the I/O buffer 6. If the number of the defective bits becomes above the correctable number, the chip becomes defective.

In the above described conventional semiconductor memory device even if several bits become defective, they are corrected by the ECC circuit, whereby correct data is externally read out. Therefore, it is not possible to foresee a chip which will be defective before hand to exchange the same to a new one before the chip becomes defective.

Therefore, proposed is a semiconductor memory device in which every time a defective bit is corrected by an ECC circuit, the number of the correction is counted by a counter. The application of the semiconductor memory device is filed on Oct. 15, 1988 as Japanese Patent Application No. 62-251930 (Counterpart U.S. application Ser. No. 253,001). However, in the semiconductor memory device, in order to grasp the number of defective bits in a chip, address signals corresponding to all the memory cells in the chip should be sequentially applied from the exterior. Thus, it is impossible with a simple operation to find deterioration state of the chip.

In addition, each time there is a need to find the number of defective bits to be corrected by the ECC circuit, such an operation as described above should be performed. Furthermore, even if the number of the defect bits to be corrected by the ECC circuit can be found, a user himself can not always use that information to identify a chip which can be expected to become defective. Besides, a user can not detect continuous defects and also can not predict the remaining life-time of a chip.

SUMMARY OF THE INVENTION

An object of the present invention is to make it possible to easily grasp from the exterior deterioration state of a chip in a semiconductor memory device.

Another object of the present invention is to make it possible to easily find deterioration state of a chip of a semiconductor memory device when necessary without performing a test every each time.

A further object of the present invention is to make it possible to foresee a generation of a defective chip of a semiconductor memory device with a simple procedure before hand.

A further object of the present invention is to make it possible to detect defective bits generated concentrated on one part in a semiconductor memory device.

A further object of the present invention is to make it possible to detect a chip having short remaining life time in a semiconductor memory device.

A semiconductor memory device according to the present invention comprises a storing device for storing a plurality of pieces of information, a test mode setting device, an error correcting device, a counting device and an outputting device. The test mode setting device sets the semiconductor memory device into a test mode. The selecting device sequentially selects the plurality of pieces of information stored in the storing device during the test mode. The error correcting device corrects the error of the information selected by the selecting device. The counting device counts the number of information to be corrected by the error correcting device. The outputting device externally outputs a result of the counting by the counting device.

By setting the semiconductor memory device into the test mode, the plurality of pieces of information stored in the storing device are sequentially selected, so that the number of information to be corrected is counted. Then, the result of the counting is outputted to the exterior. Accordingly, the number of information to be corrected can be found from the exterior of the chip with a simple procedure, thereby making it possible to easily grasp the deterioration state of the chip.

A semiconductor memory device in accordance with another aspect of the present invention comprises a storing device, an error correcting device, a counting device, a counted number storing device and an outputting device. The counted number storing device stores a result of the counting by the counting device in non-volatile manner. The outputting device externally outputs the result of the counting stored in the counted number storing device.

In the semiconductor memory device, the number of information to be corrected is counted and the result of the counting is stored in non-volatile manner. Accordingly, once a test is performed, it is possible to know the number of information to be corrected, at any time when there is a need to know the number, thereby making it possible to easily grasp the deterioration state of the chip.

A semiconductor memory device in accordance with a further aspect of the present invention comprises a storing device, an error correcting device, a counting device and a comparing device. The comparing device compares a result of the counting by the counting device with a predetermined number to externally output an error flag when the result of the counting is larger than the predetermined number.

In the semiconductor memory device, the number of information to be corrected is counted, so that when the result of the counting is larger than the predetermined value, an error flag is outputted. Accordingly, the deterioration state of the chip can be easily grasped from the exterior of the chip, so that generation of defects can be foreseen before hand.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described in detail with reference to the drawings hereinafter.

Figure 1:
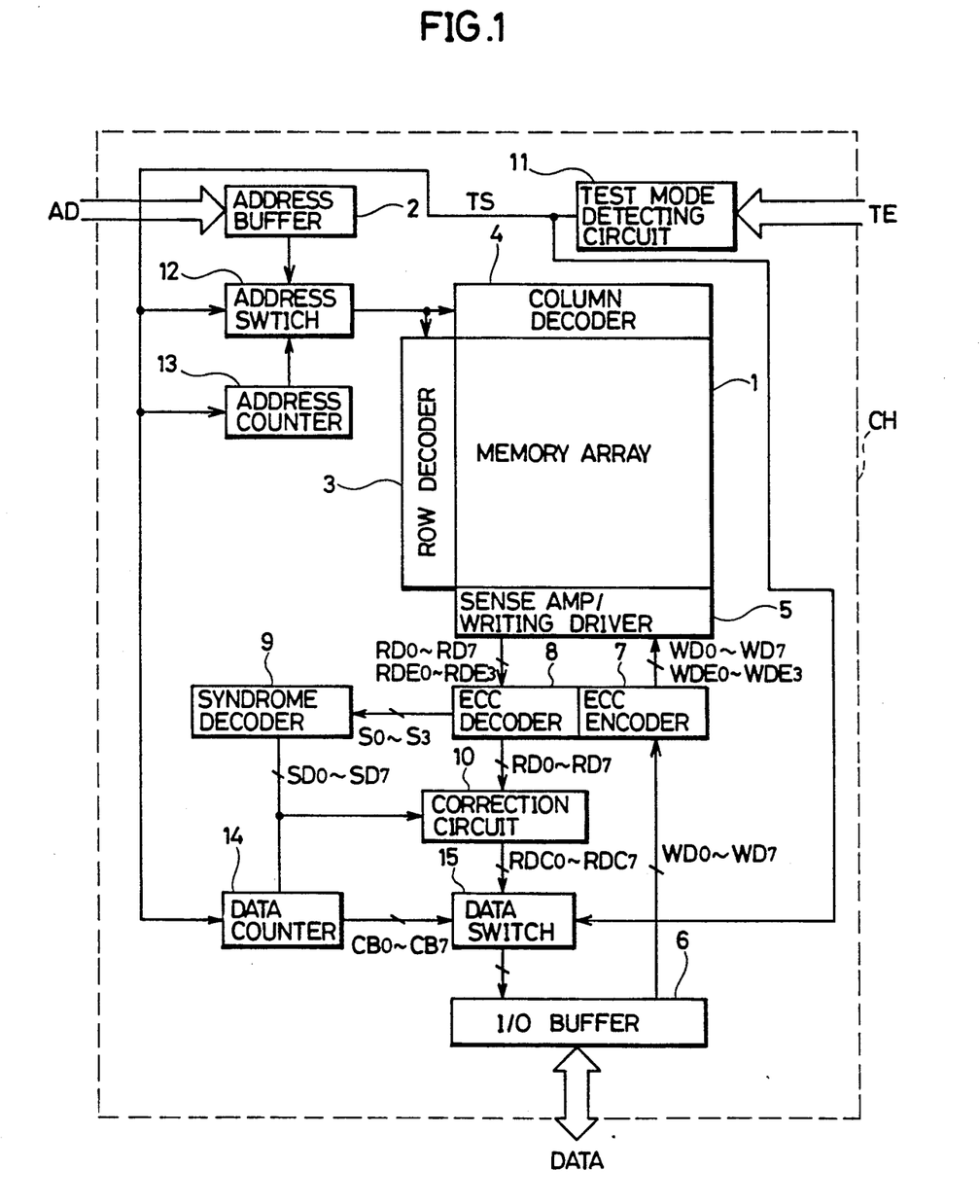
FIG. 1 is a block diagram showing a structure of a semiconductor memory device according to a first embodiment of the present invention.

In FIG. 1, a memory array 1, an address buffer 2, a row decoder 3, a column decoder 4, a sense amplifier/writing driver 5, an I/O buffer 6, an ECC encoder 7, an ECC decoder 8, a syndrome decoder 9 and a correction circuit 10 are the same as the corresponding portions in the conventional semiconductor memory device of FIG. 8. The operations of the above described portions are also the same as those of the corresponding portions in the conventional semiconductor memory device of FIG. 8.

Further provided in the semiconductor memory device of FIG. 1 are a test mode detecting circuit 11, an address switch 12, an address counter 13, a data counter 14 and a data switch 15. Each portion of the semiconductor memory device of FIG. 1 is formed on a chip CH.

The semiconductor memory device has a normal mode and an internal test mode. The address switch 12 applies an address signal outputted from the address buffer 2 to the row decoder 3 and the column decoder 4 in the normal mode and applies an address signal outputted from the address counter 13 to the row decoder 3 and the column decoder 4 in the internal test mode. The data switch 15 applies the data RDC0-RDC7 outputted from the correction circuit 10 to the I/O buffer 6 in the normal mode and applies the data CB0–CB7 outputted from the data counter 14 to the I/O buffer 6 in the internal test mode. The writing and reading operation in the normal mode is the same as that of the conventional semiconductor memory device of FIG. 8.

When a test mode enable signal TE is externally applied to the test mode detecting circuit 11, the test mode detecting circuit 11 applies a test mode setting signal TS to the address switch 12, the address counter 13 and the data switch 15, thereby setting the semiconductor memory device into the internal test mode. The data counter 14 is reset in response to the test mode setting signal TS. The address counter 13 first generates an address signal corresponding to the least significant address in response to the test mode setting signal TS to start a counting-up operation. The address switch 12 performs switching such that an output of the address counter 13 is applied to the row decoder 3 and the column decoder 4 in response to the test mode setting signal TS. This operation allows the address counter 13 to perform addressing in the memory array 1. As a result, 12 bits of data RD0–RD7, RDE0–RDE3 are read out from the memory cells selected by the row decoder 3 and the column decoder 4, and which data are amplified by the sense amplifier in the sense amplifier/writing driver 5.

The ECC decoder 8 generates 4 bits of syndromes S0–S3 based on the 12 bits of the data RD0–RD7, RDE0–RDE3 amplified by the sense amplifier. The syndrome decoder 9 decodes the syndromes S0–S3 to output the data SD0–SD7. If there is an active bit in the data SD0–SD7, which means that a defective bit exists in the read out data RD0–RD7, the defective bit is corrected by the correction circuit 10. In this case, a piece of the contents of the data counter 14 is counted up.

The above described cycle is repeated every time the address counter counts up. When the cycle for the last address is completed, the number of bytes corrected by the correction circuit 10 is to be in the data counter 14.

Since the data switch 15 performs switching such that an output of the data counter 14 is applied to the I/O buffer 6 in response to the test mode setting signal TS, the number of bytes corrected by the correction circuit 10 (the number of the ECC used bytes) is outputted externally from the I/O buffer 6.

According to the above described embodiment, simply by applying the test mode enable signal TE from the exterior, a reading test is performed in the chip and the number of the ECC used bytes is automatically counted. Therefore, the number of bytes corrected by the correction circuit in the chip can be found from the exterior with a simple procedure, thereby making it possible to exchange a chip before the generation of a defective chip.

Figure 2:
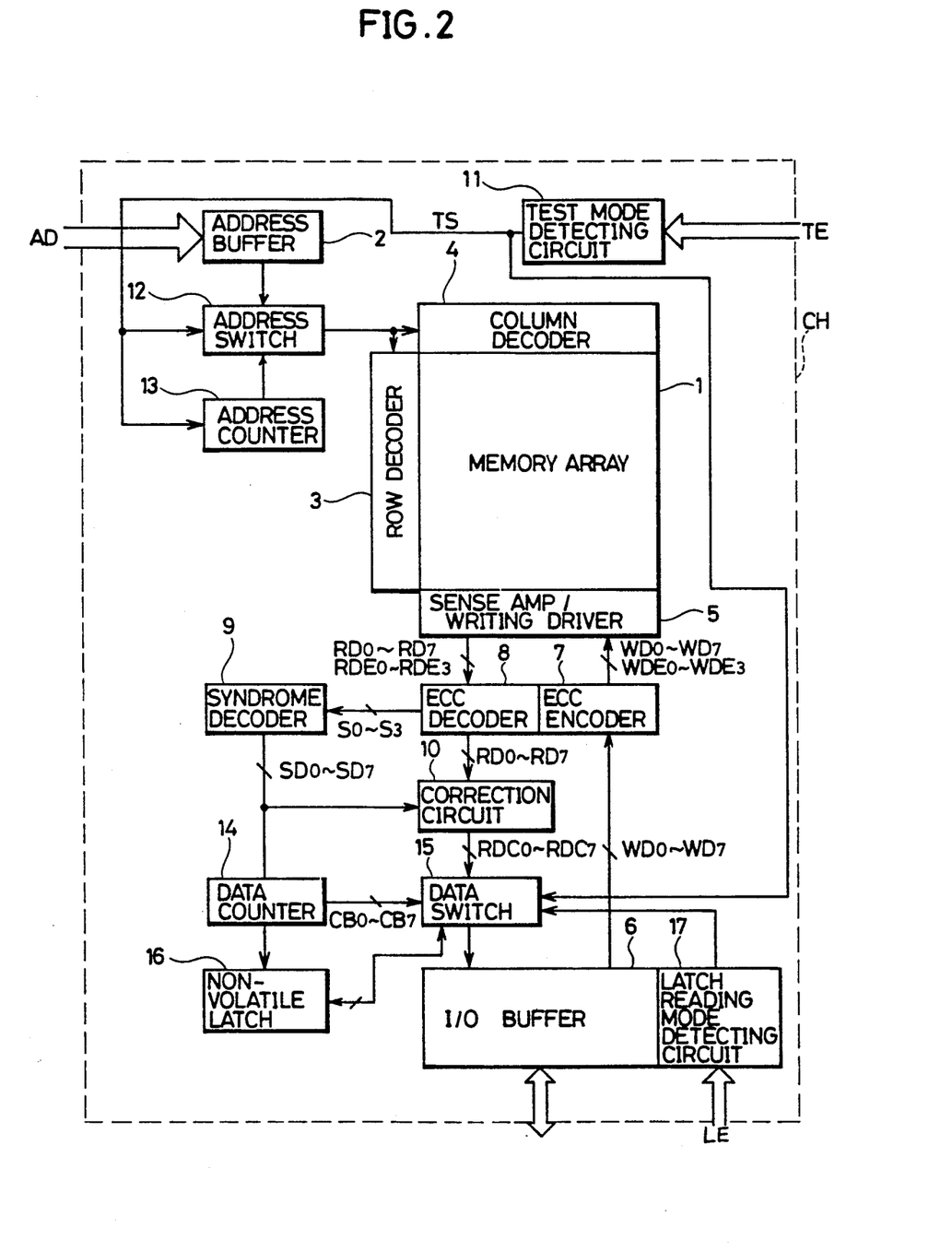
FIG. 2 is a block diagram showing a structure of a semiconductor memory device according to a second embodiment of the present invention.

Referring to FIG. 2, the semiconductor memory device of FIG. 2 differs from the semiconductor memory device of FIG. 1 in that the former is further provided with a non-volatile latch 16 and a latch reading mode detecting circuit 17. The non-volatile latch 16 stores the data counted by the data counter 14 in non-volatile manner in the internal test mode, and is comprised of, for example, EEPROM.

Operations of the semiconductor memory device of FIG. 2 in the normal mode and the internal test mode are the same as those of the semiconductor memory device of FIG. 1 except for the following point.

After the address counter 13 outputs the last address signal, whereby the test with respect to all the memory cells is completed, the data counter 14 applies the contents thereof to the non-volatile latch 16. As a result, the non-volatile latch 16 stores the number of bytes to be corrected by the correction circuit 10 in the chip in non-volatile manner.

In reading out the data stored in the non-volatile latch 16, a latch reading mode enable signal LE is applied externally to the latch reading mode detecting circuit 17, thereby setting the semiconductor memory device into a latch reading mode. In this occasion, the data switch 15 performs switching such that the data outputted from the non-volatile latch 16 is applied to the I/O buffer 6. Accordingly, the data stored in the non-volatile latch 16 is outputted externally from the I/O buffer 6.

In accordance with the above described embodiment, since the number of the ECC used bytes which has been obtained by one the internal test mode is stored in the non-volatile manner, there will be no need to perform the internal test mode many times.

Figure 3:
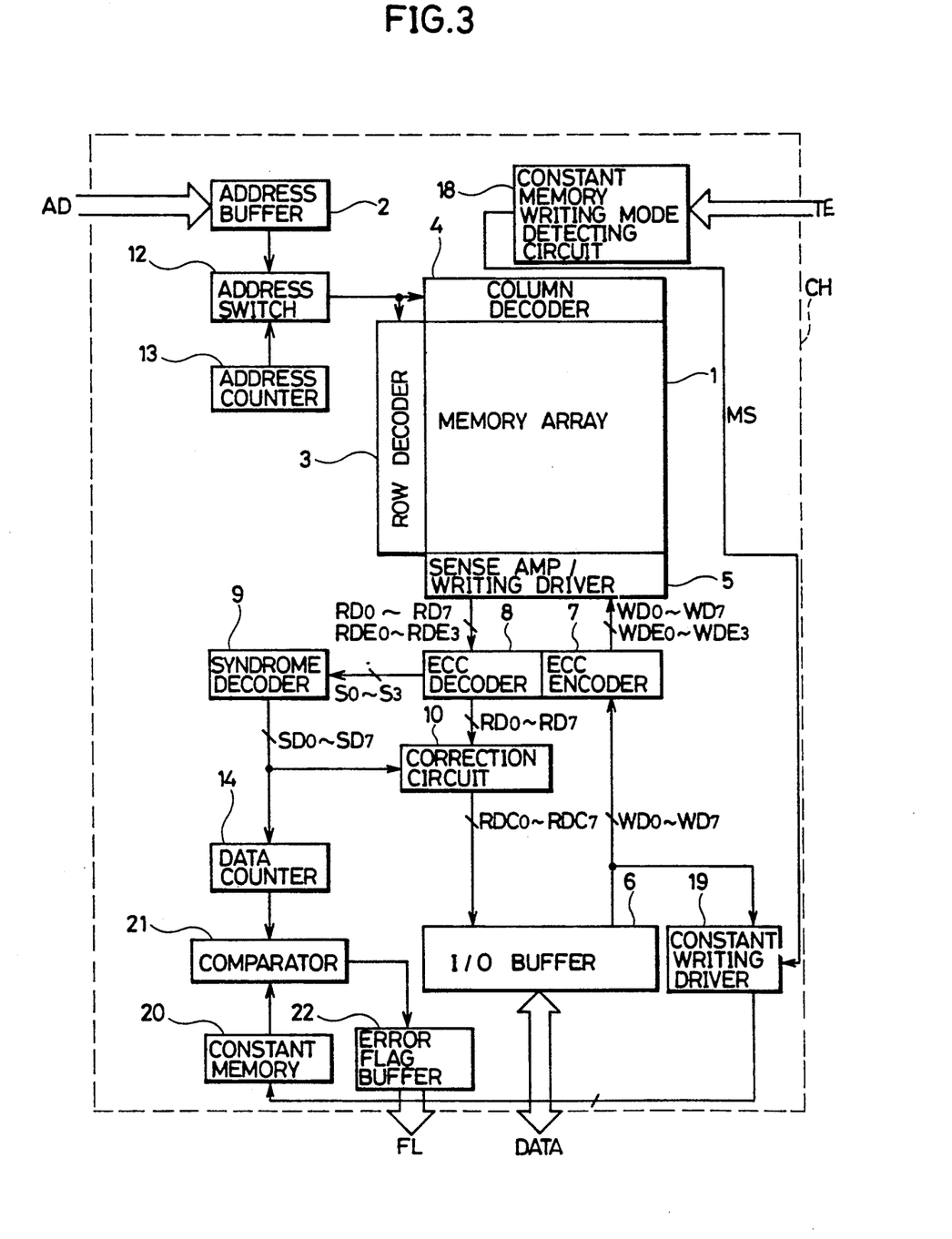
FIG. 3 is a block diagram showing a structure of a semiconductor memory device according to a third embodiment of the present invention.

Referring to FIG. 3, the semiconductor memory device of FIG. 3 differs from that of FIG. 1 in that the former is further provided with a constant memory writing mode detecting circuit 18, a constant writing driver 19, a constant memory 20, a comparator 21 and an error flag buffer 22.

The test mode detecting circuit 11 and the data switch 15 are not provided in FIG. 3.

The constant memory 20 stores a constant indicating an upper limit of the number of bytes used by the ECC. The maximum value is a value by which a rate of defective chips exceeds a predetermined percentage. The comparator 21 compares the constant stored in the constant memory 20 with the contents of the data counter 14 to render its output active when the contents of the data counter 14 are larger than the constant stored in the constant memory 20. The error flag 22 externally outputs an error flag FL if the output of the comparator 21 becomes active.

The constant memory 20 is comprised of, for example, a non-volatile memory such as EEPROM. In case the constant memory 20 is comprised of non-programmable ROMs, it is not necessary to provide the constant memory writing mode detecting circuit 18 and the constant writing driver 19.

An operation of the semiconductor memory device of FIG. 3 in the normal mode and the internal test mode is the same as that of the semiconductor memory device of FIG. 1 except for the following points.

When a memory writing mode enable signal ME is applied externally to the constant memory writing mode detecting circuit 18, the constant memory writing mode detecting circuit 18 applies a memory writing mode setting signal MS to the constant writing driver 19, thereby setting the semiconductor memory device into a constant memory writing mode. The writing driver 19 applies a constant applied externally to the I/O buffer 6 to the constant memory 20, in which the constant is stored.

In the internal test mode, the comparator 21 compares the contents of the data counter 14 with the constants stored in the constant memory 20. When the contents of the data counter 14 are larger than the constant stored in the memory 20, the output of the comparator 21 becomes active, whereby an error flag FL is outputted from the error flag buffer 22.

According to the above described embodiment, since the error flag FL is outputted when the number of bytes corrected by the correction circuit 10 is larger than a predetermined constant, it becomes possible to foresee the generation of defects before hand, and therefore it will be easy to determine whether the chip should be exchanged or not.

Figure 4:
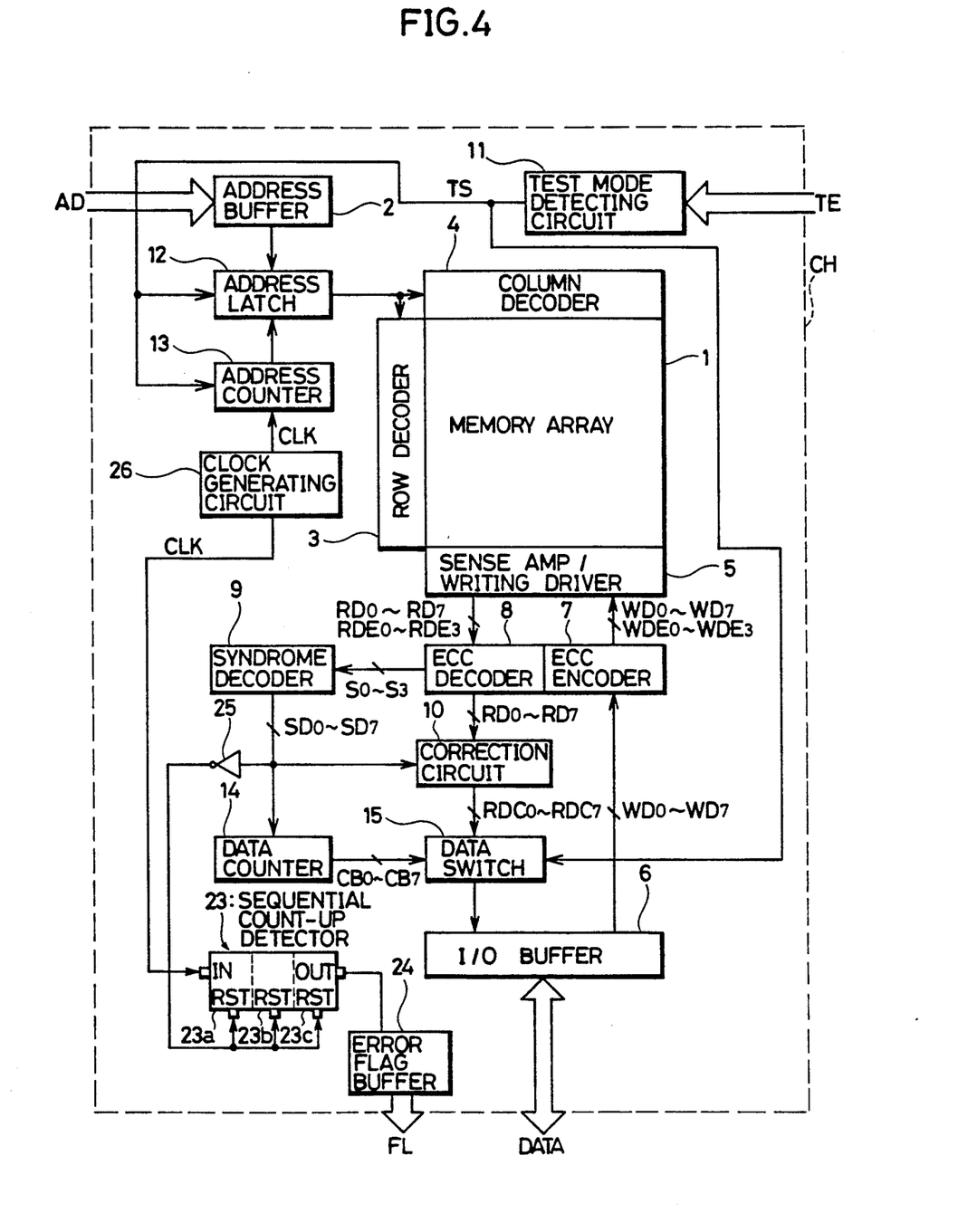
FIG. 4 is a block diagram showing a structure of a semiconductor memory device according to a fourth embodiment of the present invention.

Referring to FIG. 4, the semiconductor memory device of FIG. 4 differ from that of FIG. 1 in that the former is further provided with a sequential count-up detector 23, an error flag buffer 24, an inverter 25 and a clock generating circuit 26. The sequential count-up detector 23 detects how many times the data counter 14 counts up in succession to compare the continuous value with a predetermined maximum value. The sequential count-up detector 23 renders its output active when the continuous value is larger than the predetermined maximum value. The error flag buffer 24 externally outputs the error flag FL when the output of the sequential count-up detector 23 becomes active.

The operation of the semiconductor memory device of FIG. 4 in the normal mode and the internal test mode is the same as that of the semiconductor memory device of FIG. 1 except for the following point.

In the internal test mode, the addressing by the address counter 13 proceeds to physically adjacent addresses in the memory array 1. Therefore, in case the correction by the correction circuit 10 is successively performed, defects are concentrated on a part of the memory array 1. Accordingly, it can be considered that even if the number of the ECC used bytes is smaller than the maximum value fixed for the entire chip, the chip might becomes defective.

In the present embodiment, the output of the sequential count-up detector 23 becomes active in case the correction by the correction circuit 10 is performed three times in succession. The data counter 14 performs a counting-up operation in response to the counting-up of the address counter 13. The output of the sequential count-up detector 23 becomes active in case the counting-up of the data counter 14 is performed three times in succession, whereby the error flag FL is outputted externally from the error flag buffer 24.

Now a structure and an operation of the sequential count-up detector 23 will be described with reference to the timing chart of FIG. 6.

The sequential count-up detector 23 is comprised of, for example, a three-bit shift register comprising three registers 23a, 23b and 23c. The address counter 13 performs a counting-up operation in response to a clock signal CLK generated from the clock generating circuit 26. The clock signal CLK generated from the clock generating circuit 26 is applied to an input terminal IN of the sequential count-up detector 23. One cycle Tc of the clock signal CLK is set to be longer than an address access time Ta. An ECC enable signal $\overline{ECCEN}$ is applied to a reset terminal RST of the sequential count-up detector 23. The ECC enable signal $\overline{ECCEN}$ attains the "L" level when at least one of the data SD0–SD7 outputted from the syndrome decoder 9 becomes active.

Figure 6:
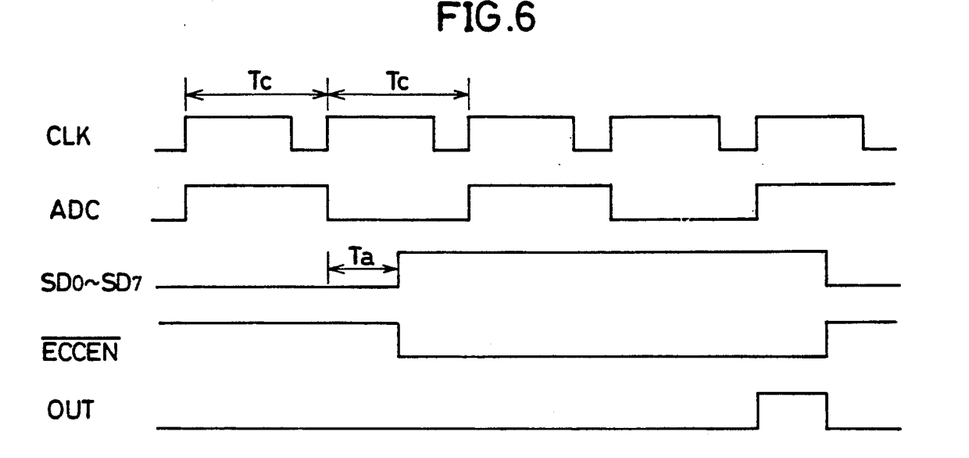
FIG. 6 is a timing chart for explaining an operation of a sequential count-up detector.

In FIG. 6, the least significant bit ADC of the address signal outputted from the address counter 13 is inverted in response to the rise of the clock signal CLK. As shown in FIG. 6, for example, at least one of the data SD0–SD7 outputted from the syndrome decoder 9 rises to the "H" level after a lapse of the address access time Ta after the least significant bit ADC of the address signal falls to the "L" level. As a result, the ECC enable signal $\overline{ECCEN}$ falls to the "L" level. Consequently, the registers 23a through 23c of the sequential count-up detector 23 enter an enable state, whereby the clock signal CLK applied to the input terminal IN is sequentially shifted to the output side during a period the ECC enable signal $\overline{ECCEN}$ is at the "L" level.

Accordingly, if the ECC enable signal $\overline{ECCEN}$ is at the "L" level during the three cycles of the clock signal CLK, a signal of the "H" level is outputted from the output terminal OUT of the sequential count-up detector 23. Namely, if the correction by the correction circuit 10 is performed three times in succession, the output of the sequential count-up detector 23 becomes active.

On the other hand, if the correction by the correction circuit 10 is not performed three times in succession, the sequential count-up detector 23 is reset before the clock signal CLK inputted to the input terminal IN of the sequential count-up detector 23 is shifted to the output terminal OUT. As a result, the output of the sequential count-up detector 23 does not becomes active.

According to the above described embodiment, since the error flag FL is outputted externally only in case the number of the ECC used bytes continue for a predetermined number, it will be possible to detect the defective bits concentrated in the memory array 1. Therefore, it is possible to exchange beforehand a chip which will be defective due to the defective bits concentrated on one part.

Figure 5:
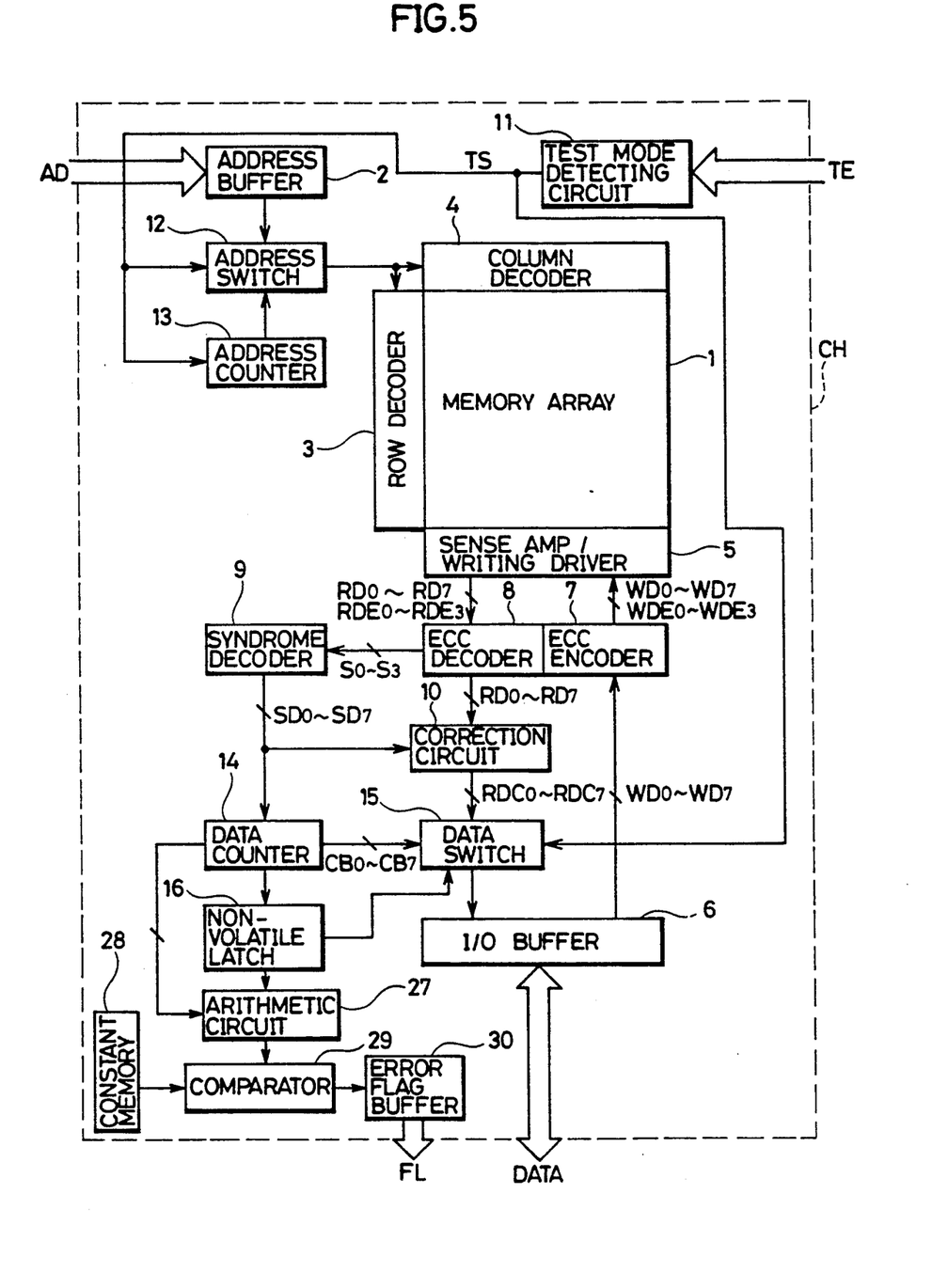
FIG. 5 is a block diagram showing a structure of a semiconductor memory device according to a fifth embodiment of the present invention.

Referring to FIG. 5, the semiconductor memory device of FIG. 5 differs from that of FIG. 2 in that the former is further provided with an arithmetic circuit 27, a constant memory 28, a comparator 29 and an error flag buffer 30. In FIG. 5, the latch reading mode detecting circuit 17 is not shown illustrated for the purpose of simplicity.

The arithmetic circuit 27 is a circuit for seeking a difference between the count data outputted from the data counter 14 and the data stored in the non-volatile latch 16. More specifically, the arithmetic circuit 27 finds a difference between the number of the ECC used bytes in the present test and the number of the ECC used bytes in the previous test. The constant memory 28 stores a maximum value of the difference between the number of the ECC used bytes in the present test and the number of the ECC used bytes in the previous test. The constant memory 28 is comprised of, for example, EEPROM, ROM or the like. The comparator 29 compares the difference obtained by the arithmetic circuit 27 with the maximum value stored in the constant memory 28 to render its output active if the difference obtained by the arithmetic circuit 27 is larger than the maximum value stored in the constant memory 28.

Operations of the semiconductor memory device in the normal mode and the external test mode are the same as those of the semiconductor memory device of FIG. 2 except for the following point.

In the internal test mode, after the address counter 13 outputs the last address signal and the number of bytes used by the ECC in the whole chip is applied to the data counter 14, the contents of the data counter 14 is sent to the non-volatile latch 16. Assuming herein that the internal test mode is executed every one thousand switching of the semiconductor memory device.

Then, after the programming operation is performed one thousand times, the semiconductor memory device is set into the internal test mode. As the previous internal test mode, when the number of the ECC used byted is applied to the data counter 14, the difference between the counted data counted by the data counter 14 and the data stored in the non-volatile latch 16 is obtained by the arithmetic circuit 27. If the difference is larger than the upper limit value stored in the constant memory 28, the output of the comparator 29 becomes active, whereby the error flag FL is outputted from the error flag buffer 30.

Figure 5A:
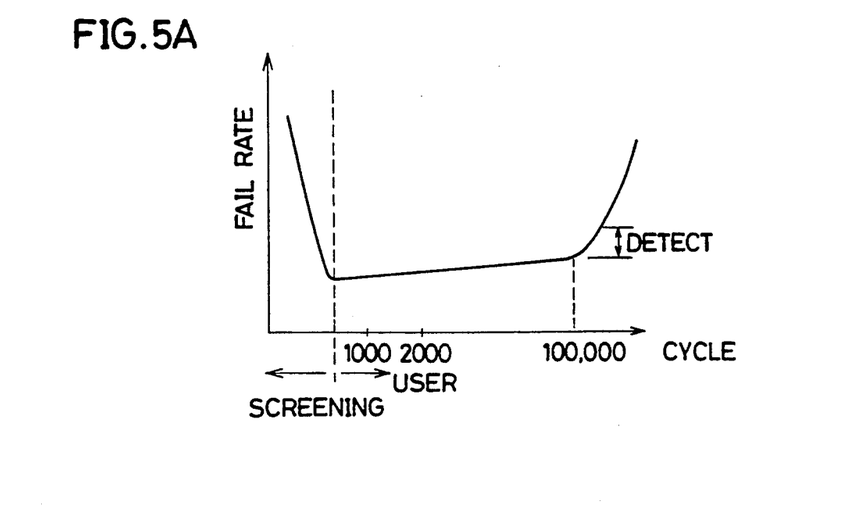
FIG. 5A is a chart showing a failure rate of a memory relative to a certain number of programming.

As shown in FIG. 5A, there is a tendency that the number of defective bits is suddenly increased when the number of programming becomes a certain number in a chip which does not have so a long remaining life. According to the above embodiment, it will be possible to detect the sudden increase of the defective bits, thereby making it possible to detect a chip having a short remaining life.

While in the above described first through fifth embodiments, the number of the ECC used bytes is detected based on the data SD0–SD7 outputted from the syndrome decoder 9, it is not limited thereto. For example, the number of the ECC used bytes may be detected based on the signal obtained using the OR logic of the four-bit syndrome S0–S3.

In addition, in the above described first to fifth embodiments, the data counter 14 is comprised of 8 bits. However, since the data counter comprising 8 bits is capable of counting only up to 256, the data counter 14 may be comprised of 16 bits. In this case, a manner may be employed in which 16 bits data are separated into most significant bits and least significant bits to be outputted from the I/O buffer 6 by using a data switch applicable to 16 bits as the data switch 15.

Furthermore, counting up to a larger number is possible by making the least significant bit of the output data to be "1" when the number of the ECC used bytes has one figure, that is, it may be any of 0 to 9 and the second bit of the output data to be "1" when the number of the ECC used bytes has two figures, that is, it may be any of 0 to 99.

Figure 7:
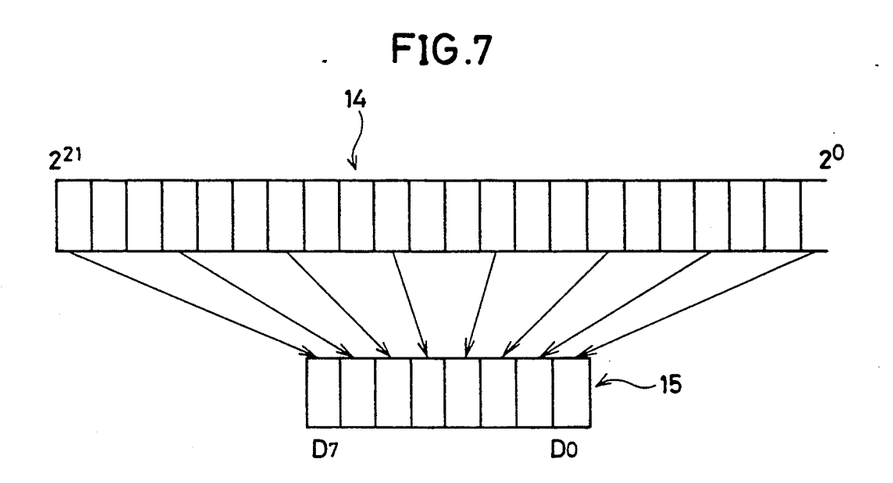
FIG. 7 is a diagram showing on example of a manner of outputting the data of a data counter.

As shown in FIG. 7, 22 binary counters may be used as the data counter 14 to send an output of every three counters to the 8-bit data switch 15. According to the example of FIG. 7, the number on the order of $2^{22}$ of defective bytes can be outputted. Therefore, according to the example of FIG. 7, a chip having a high capacity can be obtained.

While in the above described embodiments, the description is given to a case in which the present invention is applied to a non-volatile semiconductor memory device such as EEPROM, the present invention can be applied to other types of semiconductor memory devices as long as they are those containing an ECC circuit.

According to the present invention, a test is performed in the chip of the semiconductor memory device and the number of information to be corrected is counted and outputted, so that the number of the information to be corrected can be grasped from the exterior with a simple procedure, thereby making it possible to easily grasp the deterioration state of the chip. Accordingly, the chip which will be defective can be exchanged to another before hand.

In addition, since the number of the information to be corrected is counted in the chip, so that the result of the counting is stored in non-volatile manner, it is possible to know the number of the information to be corrected when necessary without performing a test several times.

Furthermore, since the number of the information to be corrected is counted in the chip, so that a flag is outputted when the result of the counting is larger than a predetermined number, the generation of defects can be foreseen with a simple procedure before the generation of the defective chips.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having an error correcting function comprising:
   storing means for storing a plurality of pieces of information,
   test mode setting means for setting said semiconductor memory device into a test mode,
   selecting means for sequentially selecting said plurality of pieces of information stored in the storing means in said test mode,
   error correcting means for correcting an error of the information selected by said selecting means,
   counting means for counting a number of pieces of information to be corrected by said error correcting means,
   outputting means for externally outputting a result of the counting by said counting means,
   said selecting means comprising an address counter for sequentially generating an address signal to address in said storing means.

2. A semiconductor memory device according to claim 1, wherein said storing means comprises an electrically programmable non-volatile memory.

3. A semiconductor memory device according to claim 1, wherein said error correcting means comprises:
   error correcting code encoding means for generating a check bit based on externally applied data to apply the data and the check bit to said storing means,
   error correcting code decoding means for generating a syndrome indicating a position of the error of the data based on the data read out from said storing means and a corresponding check bit,
   syndrome decoding means for decoding said syndrome, and
   correcting means for correcting the error of said data in response to an output of said syndrome decoding means.

4. 5. A semiconductor memory device according to claim 3, wherein said counting means counts the number of information to be corrected by said error correcting means in response to the output of pieces of said error correcting code decoding means or the output of said syndrome decoding means.

5. A semiconductor memory device according to claim 1, wherein said outputting means including switching means for externally outputting information from said error correcting means in a normal operation and externally outputting the result of the counting by said counting means in said test mode.

6. A semiconductor memory device having an error correcting function comprising:
   storing means for storing a plurality of pieces of information,
   test mode setting means for setting said semiconductor memory device into a test mode, selecting means for sequentially selecting said plurality of pieces of information stored in the storing means in said test mode, error correcting means for correcting an error of the information selected by said selecting means, counting means for counting a number of pieces of information to be corrected by said error correcting means, outputting means for externally outputting a result of the counting by said counting means, said test mode setting means setting said semiconductor memory device into a test mode in response to a control signal applied from exterior.

7. A semiconductor memory device having an error correcting function comprising:

storing means for storing a plurality of pieces of information, test mode setting means for setting said semiconductor memory device into a test mode, selecting means for sequentially selecting said plurality of pieces of information stored in the storing means in said test mode, error correcting means for correcting an error of the information selected by said selecting means, counting means for counting a number of pieces of information to be corrected by said error correcting means, counting result storing means for storing a result of the counting by said counting means in non-volatile manner, outputting means responsive to said error correcting means, counting means an counting result storing means for externally outputting error data.

8. A semiconductor memory device according to claim 7, further comprising:

setting means for setting said semiconductor memory device into a counting result reading mode, wherein said outputting means includes switching means for externally outputting information from said error correcting means in a normal operation, externally outputting the result of the counting by said counting means in said test mode and externally outputting the counting result stored in said counting result storing means in said counting result reading mode.

9. A semiconductor memory device according to claim 7, further comprising:

operating means for obtaining a difference between a present counting result by said counting means and the counting result already stored in said counting result storing means, and comparing means for comparing an operation result by said operating means with a predetermined number to output an error flag when said operation result is larger than said predetermined number.

10. A semiconductor memory device according to claim 9, wherein said comparing means comprises:

constant storing means for storing said predetermined number, and a comparator for comparing the operation result by said operating means with said predetermined number stored in said constant storing means to output an error flag when said operation result is larger than said predetermined number.

11. A semiconductor memory device having an error correcting function comprising:

storing means for storing a plurality of pieces of information, test mode setting means for setting said semiconductor memory device into a test mode, selecting means for sequentially selecting said plurality of pieces of information stored in the storing means in said test mode, error correcting means for correcting an error of the information selected by said selecting means, counting means for counting a number of pieces of information to be corrected by said error correcting means, comparing means for comparing a count of said counting means with a predetermined number to output an error flag when said count is larger than said predetermined number.

12. A semiconductor memory device according to claim 11, wherein said comparing means comprises:

constant storing means for storing said predetermined number, and comparator for comparing the count of said counting means with said predetermined number stored in said constant storing means to output the error flag when said count is larger than said predetermined number.

13. A semiconductor memory device according to claim 12, comprising constant writing means for writing an externally applied predetermined number to said constant storing means.

14. A semiconductor memory device having an error correcting function comprising:

storing means for storing a plurality of pieces of information, test mode setting means for setting said semiconductor memory device into a test mode, selecting means for sequentially selecting said plurality of pieces of information stored in the storing means in said test mode, error correcting means for correcting an error of the information selected by said selecting means, counting means for counting a number of consecutive pieces of information to be corrected, sequential error detecting means for detecting that the number of consecutive pieces of information to be corrected by said error correcting means is more than a predetermined number.

15. A semiconductor memory device according to claim 14, wherein said sequential error detecting means comprises:

clock pulse generating means for generating a clock pulse synchronizing with a selection by said selecting means, a shift register comprising a plurality of stages, and, signal generating mean responsive to no information being corrected by said error correcting means for generating a predetermined signal, said shift register receiving the clock pulse from said clock pulse generating means, sequentially shifting the clock pulse and being reset in response to said predetermined signal from said signal generating means.

16. A semiconductor memory device having an error correcting function, comprising:

storing means for storing a plurality of pieces of information, error correcting means for correcting error of the information stored in said storing means, counting means for counting a number of the information to be corrected by said error correcting means, counting result storing means for storing a result of the counting by said counting means in non-volatile manner, and outputting means for externally outputting the counting result stored in said counting result storing means.

17. A semiconductor memory device having an error correcting function according to claim 16, wherein said outputting means comprises switching means for selectively outputting to exterior the information outputted from said error correcting means, the counting result by said counting means and the counting result stored in said counting result storing means.

18. A semiconductor memory device having an error correcting function according to claim 17, further comprising:

setting means for setting said semiconductor memory device into a counting result reading mode, wherein said switching means externally outputs the information outputted from said error correcting means in a normal operation, externally outputs the counting result by said counting means in a test mode, and externally outputs the counting result stored in said counting result storing means in said counting result reading mode.

19. A semiconductor memory device having an error correcting function according to claim 16, further comprising:

operating means for obtaining a difference between a present counting result by said counting means and the counting result already stored in said counting result storing means, and comparing means for comparing an operation result by said operating means with a predetermined number to output an error flag when said operation result is larger than said predetermined number.

20. A semiconductor memory device having an error correcting function, comprising:

storing means for storing a plurality of pieces of information, error correcting means for correcting error of the information stored in said storing means, counting means for counting a number of the pieces of information to be corrected by said error correcting means, counting result storing means for storing a counting result in non-volatile manner, and comparing means responsive to said counting means and said counting result storing means for comparing a difference between the counting result stored in said counting result storing means and a count received from said counting means with predetermined number to output an error flag when said difference is larger than said predetermined number.

21. A semiconductor memory device having an error correcting function, comprising:

storing means for storing a plurality of pieces of information, error correcting means for correcting error of the information stored in said storing means, counting means for counting a number of the pieces of information to be corrected by said error correcting means, sequential error detecting means for detecting that a number of consecutive pieces of information required to be corrected by said error correcting means is more than a predetermined number.

22. A semiconductor memory device having an error correcting function, comprising:

means for storing a plurality of pieces of information;

means for detecting errors in said plurality of pieces of information stored in said storing means;

means for counting errors detected by said detecting means to obtain error data; and means responsive to said error data for generating a signal indicative of a predicted remaining lifetime of said memory device.

23. A semiconductor memory device having an error correcting function, comprising:

means for storing a plurality of pieces of information;

means for detecting errors in said plurality of pieces of information stored in said storing means and storing an error signal;

means for processing said error signal to obtain a processed error signal; and means responsive to said processed error signal for generating a signal indicative of expected remaining lifetime of said memory device.

24. A method of determining an expected remaining lifetime of a semiconductor memory comprising a plurality of memory cells, means for programming contents of the memory cells, mean for reading out the contents programmed therein and means for determining the expected remaining lifetime in accordance with error data, comprising the steps of:

setting the semiconductor memory device into a test mode;

sequentially selecting said plurality of memory cells in response to the test mode;

reading out data stored in said plurality of memory cells sequentially selected;

detecting errors in data read out from said plurality of memory cells;

counting a number of the detected errors to obtain an error count;

comparing the error count with a stored error count to obtain a difference count; and determining the expected remaining lifetime in accordance with said difference count.

25. A method of determining an expected remaining lifetime of a semiconductor memory comprising a plurality of memory cells, means for programming contents of the memory cell, means for reading out the contents programmed therein, and means for determining the expected remaining lifetime in accordance with error data, comprising the steps of:

setting the semiconductor memory device into a test mode;

sequentially selecting said plurality of memory cells in response to the test mode;

reading out data stored in said plurality of memory cells sequentially selected;

detecting errors in data read out from said plurality of memory cells;

counting a number of the detected errors to obtain an error count;

comparing the error count with a predetermined constant; and determining the expected remaining lifetime in accordance with the comparison result.

26. A method of determining an expected remaining lifetime of a semiconductor memory comprising a plurality of memory cells, means for programming contents of the memory cells, means for reading out the contents programmed therein, and means for determining the expected remaining lifetime in accordance with error data, comprising the steps of:

setting the semiconductor memory device into a test mode;

sequentially selecting said plurality of memory cells in response to the test mode;

reading out data stored in said plurality of memory cells sequentially selected;

detecting continuous errors in data read out from said plurality of memory cells; and determining the expected remaining lifetime in accordance with said continuous errors.

* * * * *